(12) United States Patent
Grottenmüller et al.

(10) Patent No.: US 9,991,182 B2
(45) Date of Patent: Jun. 5, 2018

(54) ENCAPSULATION MATERIAL FOR LIGHT EMITTING DIODES

(71) Applicant: AZ ELECTRONIC MATERIALS (LUXEMBOURG) S.A.R.L., Somerville, NJ (US)

(72) Inventors: Ralph Grottenmüller, Wiesbaden (DE); Rosalin Karunanandan, Frankfurt am Main (DE); Fumio Kita, Wiesbaden (DE); Helmut Lenz, Eschborn (DE); Dieter Wagner, Wiesbaden (DE)

(73) Assignee: AZ Electronic Materials (Luxembourg) S.A.R.L., Luxembourg (LU)

( * ) Notice: Subject to any disclaimer, the term of this patent is extended or adjusted under 35 U.S.C. 154(b) by 0 days. days.

(21) Appl. No.: 14/905,404

(22) PCT Filed: Jul. 16, 2014

(86) PCT No.: PCT/EP2014/065248
§ 371 (c)(1),
(2) Date: Jan. 15, 2016

(87) PCT Pub. No.: WO2015/007778
PCT Pub. Date: Jan. 22, 2015

(65) Prior Publication Data
US 2016/0172552 A1 Jun. 16, 2016

(30) Foreign Application Priority Data

Jul. 19, 2013 (EP) .................................... 13177289
Feb. 28, 2014 (EP) .................................... 14157208

(51) Int. Cl.
| | | |
|---|---|---|
| *H01L 23/29* | (2006.01) | |
| *C08L 83/16* | (2006.01) | |
| *H01L 33/56* | (2010.01) | |
| *C08J 3/24* | (2006.01) | |
| *H01L 33/00* | (2010.01) | |
| *C08G 77/62* | (2006.01) | |

(52) U.S. Cl.
CPC ............ *H01L 23/296* (2013.01); *C08J 3/241* (2013.01); *C08J 3/247* (2013.01); *C08L 83/16* (2013.01); *H01L 33/005* (2013.01); *H01L 33/56* (2013.01); *C08G 77/62* (2013.01); *C08J 2383/16* (2013.01); *H01L 2933/005* (2013.01); *H01L 2933/0033* (2013.01)

(58) Field of Classification Search
CPC ............................ H01L 23/296; H01L 33/56
USPC ................................................ 257/788, 791
See application file for complete search history.

(56) References Cited

U.S. PATENT DOCUMENTS

| | | | |
|---|---|---|---|
| 2,264,674 A | 12/1941 | Murray | |
| 4,395,460 A | 7/1983 | Gaul | |
| 4,689,252 A * | 8/1987 | Lebrun | ............... C04B 20/1051 423/344 |
| 4,722,988 A * | 2/1988 | Porte | ..................... C04B 35/589 522/148 |
| 4,954,596 A | 9/1990 | Takeda et al. | |
| 5,030,744 A | 7/1991 | Funayama et al. | |
| 6,204,523 B1 | 3/2001 | Carey et al. | |
| 6,274,924 B1 | 8/2001 | Carey et al. | |
| 6,329,487 B1 * | 12/2001 | Abel | ........................ C07F 7/21 528/21 |
| 2002/0113241 A1 | 8/2002 | Kubota et al. | |
| 2009/0252975 A1 | 10/2009 | Lee et al. | |
| 2011/0156221 A1 | 6/2011 | Rode et al. | |
| 2015/0376407 A1 * | 12/2015 | Joo | ......................... C08L 83/04 525/101 |

FOREIGN PATENT DOCUMENTS

| | | |
|---|---|---|
| DE | 102008044769 A1 | 3/2010 |
| DE | 102011009873 A1 | 3/2012 |
| DE | 102011009773 A1 | 8/2012 |
| EP | 0389084 A2 | 9/1990 |
| EP | 2206746 A1 | 7/2010 |
| JP | 2002222691 A | 8/2002 |
| JP | 2004363342 A | 12/2004 |
| JP | 2005057239 A | 3/2005 |
| JP | 2011146144 A | 7/2011 |
| KR | 101238738 B1 | 3/2013 |
| KR | 20130072990 A | 7/2013 |
| WO | WO-11077547 A1 | 6/2011 |
| WO | WO 2012/067766 A2 * | 5/2012 |
| WO | WO 2014/133287 * | 9/2014 |

OTHER PUBLICATIONS

Machine translation of DE 10 2011 009873 into English (no date).*
Schwark, J., et al., "Isocyanate-Modified Polysilazanes: Conversion to Ceramic Materials", Mat. Res. Soc. Symp. Proc., 1992, vol. 271, pp. 807-812.

* cited by examiner

*Primary Examiner* — Marc Zimmer
(74) *Attorney, Agent, or Firm* — Drinker Biddle & Reath LLP (57) ABSTRACT

The invention relates to the use of specific organopolysilazanes as an encapsulation material for light emitting diodes (LED). The organopolysilazane polymers act as insulating filling materials and are stable over temperature and over exposure to ambient UV radiation. The encapsulating material has good thermal stability against discoloration to yellow by aging even at high temperatures which is a key factor for the long lifetime of an LED encapsulant and the LED performance.

24 Claims, 3 Drawing Sheets

ENCAPSULATION MATERIAL FOR LIGHT EMITTING DIODES

The invention relates to the field of light emitting diode (LED) technology. Especially the invention relates to an LED encapsulation material. The invention further relates to the field of organopolysilazanes that can be used as an encapsulating material for LEDs.

There is a high demand in the electronic industry to find suitable encapsulating polymer materials for LEDs. Such materials face several challenges:

The polymer has to withstand high temperatures without degradation in mechanical and/or optical properties, The polymer needs to have, in addition to optical clarity and high temperature service, the advantageous property of a high refractive index, The capability of the polymer to withstand exposure to radiation of high intensity has to be high, and There is a need for materials that can be varied in elastic modulus across a range from very soft gel materials to hard plastic materials.

LEDs can generate both high thermal flux and high optical flux. The LED package as well as the encapsulation material need to perform stably when exposed to heat and/or radiation (ultra-violet and/or visible radiation). The right encapsulation material plays a major role in improving LED performance. So far many encapsulation materials suffer from, among other, loss of transmittance during the lifetime of usage of the LED. In the following, advantages and remaining disadvantages of the main encapsulation materials are shown. Silicon-based materials are currently dominating the market because of their properties (optical, mechanical and aging). Silicone reflectors improve brightness performance, show superior heat resistance and photothermal stability. With silicone-based reflectors there is no degradation of the LED light intensity; they reflect light with a high efficiency of more than 98%. Silicones as protective films on chips show high heat resistance. The silicone can be compounded with phosphor to make white LED. Silicones can be dispensed or molded easily. Main applications are general lighting products and backlighting products in LCD.

The disadvantage of silicones is that they are highly transmissive and gas permeable. At elevated temperatures chemical contaminants such as volatile organic compounds (VOCs) outgassing from the circuit board can cause discoloration. VOCs can accelerate the degradation of LEDs or impair the performance of LEDs. The effect of chemical incompatibility was seen in blue and white LEDs but not in red or green LEDs. Silicones are also permeable for moisture which enhances degradation and reduces the LED performance. Another disadvantage of silicones is the high CTE (320 ppm/° C., Electronic Packaging and Interconnection Handbook). The refractive index should also be higher.

The advantages of glass are superior optical properties and durability. That makes it attractive for high end applications. But clear disadvantages of glass are its incompatibility with standard LED manufacturing processes.

Epoxies are known for their excellent adhesion, chemical and heat resistance, good-to-excellent mechanical properties and very good electrical insulating properties. But epoxies have poor aging characteristics. They show poor moisture resistance due to high water absorption and especially poor light resistance due to low transmittance for a short wavelength light.

Development in new materials (e.g. polycarbonates and cycloolefin copolymers) remains active.

The choice of the right encapsulation material is highly driven by its aging stability against UV and high temperature as well as its processability. New materials with more efficiency, that means more light output as well as longer durability (<50000 h, YOLE), are in high demand. Until now, no polymers have been reported with a high refractive index and high transparency accompanied by resistance to yellowing induced by thermal degradation above 150° aging in air (Kim et al., 2010, Chemistry of Materials).

It has now been found that specific organopolysilazanes are useful as encapsulation materials for light emitting diodes.

JP-A 2005-057239 and JP-A 2004-363342 disclose the use of organopolysilazanes for preparing an encapsulation material for LEDs, which consists of siloxane. The use of organopolysilazanes as the actual encapsulation material is not mentioned in these documents.

KR-B 10-12 38 738 and KR-A 10-2011-0140644 disclose polysilazanes as encapsulation materials for LEDs and UVLEDs. Perhydropolysilazanes and organopolysilazanes with alkyl and aryl groups as organic substituents are mentioned. No concrete examples are given.

WO 2012/067766 discloses LEDs comprising a polysilazane bonding layer. The bonding layer typically further comprises a (meth)acrylate monomer.

Accordingly, in one aspect of the invention the use of an organopolysilazane material is provided, comprising repeating units of formulae (I) and (II), as an encapsulating material for a light emitting diode, $$[-SiR^1R^2-NR^3-]_x \quad (I)$$

$$[-SiHR^4-NR^5-]_y \quad (II)$$

wherein the symbols and indices have the following meanings:

$R^1$ is $C_2$-$C_6$-alkenyl or $C_4$-$C_6$-alkadienyl, preferably vinyl or allyl, more preferably vinyl;

$R^2$ is H or an organic group;

$R^3$ is H or an organic group, preferably H;

$R^4$ is H or an organic group, preferably an organic group;

$R^5$ is H or an organic group, preferably H;

x is 0.001 to 0.2; and y is 2*x to (1−x), with the proviso that x+y≤1 and that y can be 0 if $R^2$ is H, where x and y denote the molar ratio of these repeating units with respect to the total of all repeating units Si—N in the organopolysilazane material.

In a further aspect of the invention a process for producing an LED is provided, comprising the steps of a) applying an organopolysilazane of the invention to the LED as an encapsulating layer and b) curing the organopolysilazane of the invention for 1 min to 6 h at a temperature of from 80° C. to 220° C. in an inert atmosphere or air.

In a further aspect of the invention an encapsulating material for LEDs is provided, obtainable by providing an organopolysilazane of the invention and curing the organopolysilazane for 1 min to 6 h at a temperature of from 80° C. to 220° C. in an inert atmosphere or air.

In yet a further aspect of the invention an LED is provided, comprising the encapsulation material of the invention.

The organopolysilazane material of the invention is applied to the LED as an encapsulation material.

"Encapsulation material" or "encapsulant" as used herein means a material that covers the light emitting material (LED chip) and forms a barrier between the light emitting material of the LED device and the external environment of the LED device. The encapsulating material is preferably in direct contact with the light emitting material of the LED. The encapsulation material can be part of a package comprising the light emitting material and/or lead frame and/or gold wire, and/or solder (flip chip) the filling material, converter and a primary and secondary optic. The encapsulation material can cover the light emitting material and/or lead frame and/or gold wire and may contain a converter. The encapsulation material has the function of a surface protection material against external environmental influences and guarantees long term reliability that means aging stability. In general the layer of the encapsulation material has a thickness of from 100 µm to 1 cm, preferably of from 200 µm to 5 mm.

The external environmental influence can be chemical or mechanical like moisture or chemicals (e.g. acids, bases, oxygen within others). The external environmental influence can also be temperature. The encapsulant shows temperature resistance between −55 to +260° C. The encapsulation material of the invention can act as a binder for the converter, such as phosphor powders or quantum dots. The encapsulant can be shaped in order to provide primary optic functions (lens). The encapsulant can also act as a glue material, e.g. to attach lenses to the LED package. The encapsulant shows good adhesion to substrates (inter alia Si, sapphire and SiC).

"LED" as used herein means an LED device comprising the light emitting material, i.e. a light emitting diode, as well as the other components like LED chip, and/or lead frame, the filling materials, converters, primary and secondary optics, and/or wiring and/or solder.

The encapsulation material of the invention may comprise a converter, i.e. in one embodiment of the invention the encapsulation material comprises a converter, and in a further embodiment of the invention the encapsulation material of the invention does not comprise a converter.

According to the invention, a specific organic polysilazane material is used in an LED as an encapsulating material.

The organopolysilazane material according to the invention comprises repeating units of formula (I) and (II)

$$[-SiR^1R^2-NR^3-]_x \qquad (I)$$

$$[-SiHR^4-NR^5-]_y \qquad (II)$$

as described above.

"Organopolysilazane" as used herein is intended to include any oligomeric or polymeric composition. In addition, the term "organopolysilazane" denotes a compound which includes four or more Si—N units in which the nitrogen atoms are bonded to at least two silicon atoms. "Oligomer" is also intended to mean a molecule or chemical compound comprising several repeat units, generally from about 4 to 10 repeat units. "Polymer", as used herein, means a molecule or compound which comprises a large number of repeat units, i.e. greater than 10 repeat units.

The oligomeric or polymeric organosilazanes of this invention may be amorphous or crystalline in nature. Such compositions may be liquids or solids which are cyclic, linear or cyclo-linear in nature.

The structure shown in formulae (I) and (II) is only a simplified representation showing the monomers used for synthesis. In reality the structure of the oligomers and polymers is not only linear, but predominantly consists of separate or condensed rings and three-dimensional arrangements. Organosilazanes, therefore, contain tertiary (referring to silicon) nitrogen "Si$_3$N" and possibly primary nitrogen "SiNR$_2$" beside secondary nitrogen "Si$_2$NR". Likewise they contain tertiary (referring to nitrogen) Si-groups "N$_3$SiR", possibly primary Si-groups "NSiR$_3$" beside secondary Si-groups "N$_2$SiR$_2$". The exact structure may vary, e.g. based on the specific synthesis and the nature of the groups R.

Preferably the symbols and indices in formulae (I) and (II) have the following meanings:
$R^1$ is preferably (C$_2$-C$_6$)-alkenyl or (C$_4$-C$_6$)-alkadienyl.
$R^2$ is preferably (C$_1$-C$_8$)-alkyl, (C$_2$-C$_6$)-alkenyl, (C$_3$-C$_6$)-cycloalkyl, (C$_6$-C$_{10}$)-aryl or H.
$R^3$ is preferably H or (C$_1$-C$_8$)-alkyl, (C$_2$-C$_6$)-alkenyl, (C$_3$-C$_6$)-cycloalkyl or (C$_6$-C$_{10}$)-aryl.
$R^4$ is preferably H or (C$_1$-C$_8$)-alkyl, (C$_2$-C$_6$)-alkenyl, (C$_3$-C$_6$)-cycloalkyl or (C$_6$-C$_{10}$)-aryl.
$R^5$ is preferably H or (C$_1$-C$_8$)-alkyl, (C$_2$-C$_6$)-alkenyl, (C$_3$-C$_6$)-cycloalkyl or (C$_6$-C$_{10}$)-aryl.
x is preferably 0.02 to 0.1.
y is preferably 2*x to 0.98.

Preferred are organopolysilazanes comprising repeating units (I) and (II) where all the symbols and indices in formulae (I) and (II) have the preferred have the preferred meanings.

More preferably the symbols and indices in formulae (I) and (II) have the following meanings:
$R^1$ is more preferably vinyl or allyl.
$R^2$ is more preferably (C$_1$-C$_4$)-alkyl, phenyl or H.
$R^3$ is more preferably H.
$R^4$ is more preferably (C$_1$-C$_4$)-alkyl, phenyl or H.
$R^5$ is more preferably H.
x is more preferably 0.03 to 0.075.
y is more preferably 2*x to 0.97.

More preferred are organopolysilazanes comprising repeating units (I) and (II) where all the symbols and indices in formulae (I) and (II) have the more preferred meanings.

Particularly preferably the symbols and indices in formulae (I) and (II) have the following meanings:
$R^1$ is particularly preferably vinyl.
$R^2$ is particularly preferably methyl, ethyl, propyl or phenyl.
$R^3$ is particularly preferably H.
$R^4$ is particularly preferably methyl, ethyl, propyl or phenyl.
$R^5$ is particularly preferably H.
x is particularly preferably 0.03 to 0.06.
y is particularly preferably 2*x to 0.97.

Particularly preferred are organopolysilazanes comprising repeating units (I) and (II) where all symbols and indices in formulae (I) and (II) have the particularly preferred meanings.

"Alkyl" as used herein means a linear or branched, preferably linear alkyl group, which is unsubstituted or substituted, preferably unsubstituted. Examples are methyl, ethyl and n-propyl and isopropyl. "Alkenyl" as used herein means a linear or branched, preferably linear alkenyl group, which is unsubstituted or substituted, preferably unsubstituted. Examples are vinyl or allyl.

"Alkadienyl" as used herein means a linear or branched, preferably linear, alkyl group, comprising two carbon-carbon double bonds which are conjugated or non-conjugated, which is unsubstituted or substituted, preferably unsubstituted. Examples are 1.3-butadienyl and 1,5-hexadienyl.

"Cycloalkyl" as used herein means an unsubstituted or substituted, preferably unsubstituted cycloalkyl group, e.g. cyclopropyl or cyclohexyl.

"Aryl" as used herein means an aryl group which is unsubstituted or substituted, preferably unsubstituted, and is preferably phenyl.

If an alkyl, alkenyl or alkadienyl group is substituted, it is substituted with one or more, preferably one substituent, preferably selected from the group consisting of SiOR'$_3$ (R' being C$_1$-C$_4$-alkyl), OR" (R" being an aliphatic, cycloaliphatic or aromatic group), and aromatic groups. The organopolysilazane material of the invention consists of one or more organopolysilazanes. In one embodiment the organopolysilazane material comprises an organopolysilazene comprising repeating units of formulae (I) and (II). In another embodiment, the organopolysilazane material comprises an organopolysilazane comprising repeating units of formulae (I) and another organopolysilazane comprising repeating units of formula (II).

In a further preferred embodiment of the organopolysilazane material of the invention, the repeating units of formulae (I) and (II) are those of formulae (Ia) and (IIa), respectively,

[—SiR$^1$R$^2$—NR—]$_x$  (Ia)

[—SiHR$^4$—NR—]$_y$  (IIa)

where the symbols and indices have the meanings and preferred meanings given above.

In a further preferred embodiment, R$^2$, R$^3$ and R$^4$, R$^5$ independently of one another are a radical from the group consisting of methyl, ethyl, propyl, isopropyl, butyl, isobutyl, tert-butyl, phenyl, vinyl, 3-(triethoxysilyl)propyl, and 3-(trimethoxysilyl)propyl) or R$^2$, R$^3$ are hydrogen.

Particular preference is given to an organopolysilazane material in which R$^1$ is vinyl, R$^2$ is methyl, R$^3$ is hydrogen, R$^4$ is methyl and R$^5$ is hydrogen.

In one preferred embodiment the organopolysilazane material of the invention comprises an organopolysilazane comprising and preferably consisting of repeating units of the formulae (I) and (II).

In a preferred embodiment of this material the repeating units of the formula (I) and (II) are —[—SiH(CH$_3$)—NH—]$_x$—  (I-1)

and

—[—Si(CH$_3$)(CH=CH$_2$)—NH—]$_y$—  (II-1)

In a preferred embodiment of this material, x is from 0.50 to 0.95 and y is from 0.50 to 0.05 and in a more preferred embodiment of this material x is from 0.70 to 0.90 and y is from 0.30 to 0.10. In cases where x+y do not add up to 1, one or more further repeating units are present.

In a particularly preferred embodiment of this material x=0.8 and y=0.2.

Such a material is commercially available under the tradename DURAZANE 1800 (formerly HTT 1800) from AZ Electronic Materials GmbH, Germany.

In one embodiment of the invention, the organopolysilazane material consists of an organopolysilazane consisting of repeating units of formulae (I) and (II), preferably (I-1) and (II-1), in particular in the ratio of x=0.8 and y=0.2.

In a further embodiment, the organopolysilazane material of the invention comprises one or more organopolysilazane comprising a repeating unit of formula (I) and/or formula (II) and one or more, preferably one or two, more preferably one, repeating units of formula (III) and/or (IV), (III)

(IV)

wherein

R$^6$, R$^7$, R$^9$, R$^{10}$ are independently an organic group;

R$^{10}$ is H or an organic group, and

R$^8$ and R$^{11}$ are independently H or an organic group.

Preferably the symbols in formulae (III) and (IV) have the following meanings:

R$^6$, R$^7$ and R$^9$ are preferably independently (C$_1$-C$_8$)-alkyl, (C$_3$-C$_6$)-cycloalkyl or (C$_6$-C$_{10}$)-aryl.

R$^{10}$ is preferably independently (C$_1$-C$_8$)-alkyl, (C$_3$-C$_6$)-cycloalkyl or (C$_6$-C$_{10}$)-aryl, (C$_2$-C$_6$)-alkenyl, (C$_4$-C$_6$)-alkadienyl or H.

R$^8$ and R$^{11}$ are preferably independently H, (C$_1$-C$_8$)-alkyl, (C$_3$-C$_6$)-cycloalkyl or (C$_6$-C$_{10}$)-aryl.

Preferred are repeating units (III) and/or (IV) where all the symbols have the preferred meanings.

More preferably the symbols in repeating units (III) and/or (IV) have the following meanings:

R$^6$, R$^7$ and R$^9$ are more preferably independently (C$_1$-C$_4$)-alkyl or phenyl.

R$^{10}$ is more preferably (C$_1$-C$_4$)-alkyl, phenyl, vinyl, allyl, or H.

R$^8$ and R$^{11}$ are more preferably H, (C$_1$-C$_4$)-alkyl or phenyl.

More preferred are repeating units (III) and/or (IV) where all the symbols have the more preferred meanings.

Particularly preferably the symbols in repeating units (III) and/or (IV) have the following meanings:

R$^6$, R$^7$ and R$^9$ are particularly preferably independently methyl, ethyl, propyl or phenyl.

R$^{10}$ is particularly preferably methyl, ethyl, propyl, phenyl, vinyl or H.

R$^8$ and R$^{11}$ are particularly preferably independently H methyl, ethyl, propyl or phenyl.

Particularly preferred are repeating units (III) and/or (IV) where all the symbols have the particularly preferred meanings.

If R$^6$, R$^7$, R$^8$, R$^9$, R$^{10}$, or R$^{11}$ are alkyl, the alkyl group is linear or branched, and is unsubstituted or substituted, preferably with one or more substituents selected from the group consisting of Si(OR')$_3$ (R' being (C$_1$-C$_4$)-alkyl, preferably methyl or ethyl), OR" (R" being an aliphatic, cycloaliphatic or aromatic group), and aromatic groups

Examples of repeating units (III) are:

-continued

Examples of particularly preferred repeating units (IV) are:

A typical material comprising repeating units (II) and (III) is

Such a material is available as Durazane 1033 (formerly ML 33) from AZ Electronic Materials Germany GmbH, Wiesbaden, Germany. The organopolysilazanes can be obtained under the respective tradenames from AZ Electronic Materials Germany GmbH, Wiesbaden, Germany.

In one embodiment the organopolysilazane material of the invention comprises an organopolysilazane consisting of one or more, preferably one, repeating units of formula (I), one or more, preferably one repeating unit of formula (II), and one or more, preferably one or two, more preferably one, repeating units of formula (III) and/or (IV), preferably of formula (III).

In one embodiment the organopolysilazane material of the invention comprises an organopolysilazane consisting of a repeating unit of formula (I), a repeating unit of formula (II) and one or more, preferably one or two, more preferably one, repeating units of formula (III) and/or (IV), preferably of formula (III).

An example of a preferred organopolysilazane is and and

In one embodiment the organopolysilazane material consists of one or more, preferably one of the above, organopolysilazanes.

It is known to those skilled in the art that, due to the crosslinking between different organopolysilazanes comprising repeat units of the formula (I) and (II) that takes places during the optional crosslinking step and the curing step, the final polysilazane material will be one organopolysilazane, even if it is obtained by mixing different organopolysilazanes.

In a further embodiment the organopolysilazane material of the invention is obtained by mixing one or more, preferably one or two, organopolysilazanes consisting of a repeating unit of formula (I) and, optionally, one or two repeating units of formula (II), and of one or two, preferably one, organopolysilyzanes consisting of one or two repeating units of formula (II), and of one or two, preferably one, repeating units of formula (III) and/or (IV), preferably of formula (III).

In one preferred embodiment of the invention, the organopolysilazane material is a mixture or preferably obtained from a mixture of Durazane 1033 (formerly ML-33) and DURAZANE-1800 (see above).

The ratio of Durazane 1033 (formerly ML-33) to DURAZANE-1800 is preferable from 90%:10% to 10%:90%, more preferable from 85%:15% to 25%:75%, and particularly preferable 80%:20% to 50%:50% (all percentages by weight).

Further, the synthesis of these materials is well known to those skilled in the art and usually is carried out by reacting dichlorosilanes with ammonia according to the following equation:

It is described in a multitude of patents, e.g. U.S. Pat. No. 4,395,460, U.S. Pat. No. 2,264,674, U.S. Pat. No. 4,954,596 and U.S. Pat. No. 6,329,487.

In a preferred embodiment of the invention, the organopolysilazane material is subjected to a pre-crosslinking treatment before being applied to the LED. In this way, the amount of low molecular weight material is reduced, which leads to a reduced loss of material due to evaporation in the final curing step.

Several methods have been described for such a crosslinking, e.g. in U.S. Pat. No. 6,329,487. Further crosslinking by the reaction with isocyanates (J. Schwank, Mat. Res. Soc. Syn. Proc 271 (1992) 807) or the introduction of boron bridges (EP-A 0 389 084) has been reported.

In a preferred embodiment of the invention, an organopolysilazane material of the invention is produced by a process, comprising the step of reacting an organopolysilazane comprising SiH and NH bonds, and preferably comprising structural units of the following formula, wherein R is an organic group bonded through carbon, with a base catalyst in order to form a crosslinked product.

Crosslinking of organopolysilazanes comprising N—H and SiH bonds can be effected by the catalytic action of various basic compounds with a base strength strong enough to activate the N—H and/or Si—H group of the organosilazane. Suitable bases are, for example, strong tertiary amines, amides of the type $R^1R^2NM$, with $R^1$ and $R^2$ being independently hydrogen or an organic moiety and M being an cationic counterion like alkali or earth alkali or an organometallic base like butyl-lithium or Grignard compounds. The catalytic crosslinking reaction has to be performed in a non-reactive solvent at a suitable temperature to avoid a too vigorous or too slow reaction.

A variety of basic compounds with a base strength strong enough to activate the N—H and/or Si—H group of the organosilaznes can be used as catalyst. For example, strong tertiary amines $R_3N$ like 1,8-diazabicyclo[5.4.0]undec-7-ene or 1,5-diazabicyclo[4.3.0]non-5-ene are possible. Other types of base catalysts are amides of the general formula $R_aR_bNM$ with $R_a$ and $R_b$ being independently hydrogen or an organic moiety and M a cationic counterion like alkali or earthalkali. Examples are $NaNH_2$, $Ca(NH_2)_2$, $LiN(i-C_3H_7)_2$ and $KN(SiMe_3)_2$. Hydrides like NaH, $CaH_2$, $LiAlH_4$ or KH are possible too. Other types of base catalysts are organometallic bases, for example butyl-lithium, or Grignard compounds, like alkyl- or aryl-magnesium-bromides. The catalytic crosslinking reaction has to be performed in a solvent which is inert under strong alkaline conditions and non-reactive with the organosilazane and especially the Si—H groups. Useful solvents are alkanes, ethers and aromatic compounds. Examples of useful solvents are n-heptane, cyclohexane, THF, 1,4-dioxane, di-propylether, toluene and xylene. The reaction has to be performed at a suitable temperature to avoid a too vigorous or too slow reaction. Typical reaction temperatures are in the range of −20° C. up to +100° C. It is important to select the correct combination of catalyst, solvent and temperature to ensure smooth reaction and an appropriate degree of crosslinking.

$M_w$ is determined by GPC against a polystyrene standard.

The GPC conditions are the following: the eluent is a mixture of THF and 1.45 wt.-% hexamethyldisilazane, the columns are Shodex KS-804 and 2×KS-802 and KS-801 and the detector is Agilent 1260 Refractive Index Detector. The calibration is done with polystyrene standards.

Viscosity is determined by using the following equipment and conditions:
Brookfield Rheometer R/S plus, Brookfield cone-type spindle $RC_3$-50-1, rotation speed of 3 rpm, Temperature 25° C.

Preferably the amount of low molecular weight material ($M_w$<500 g/mol) in the organopolysilazane material is below 15 wt.-%, more preferably <10 wt.-%, particularly preferably <8 wt.-%.

Further, the amount of low molecular weight material with an $M_w$<1000 g/mol is preferably below 40 wt.-%, more preferably <30 wt.-%, particularly preferably <25 wt.-%.

The amount of low molecular weight material can be reduced e.g. by the reaction conditions of the polycondensation reaction, by purification of the organopolysilazanes, and, preferably, by the above described crosslinking reaction.

A further constituent of the organopolyliazane material may be additives, which, for example, influence formulation viscosity, substrate wetting, film formation, or evaporation behavior. In a further preferred embodiment the organopolysilazane material contains up to 50% inorganic fillers, in particular nanoparticles, such as $SiO_2$, $TiO_2$, ZnO, $ZrO_2$, $Al_2O_3$, $CeO_2$, $BaTiO_3$ and $SnO_2$.

The encapsulation material can include up to 50% converters, adhesion promotors and/or softening agents. In one embodiment the encapsulation material does not comprise a converter. In another embodiment the encapsulation material comprises a converter.

In order to produce a mixture of the organopolysilazane material with additives, generally the components are dissolved or dispersed in a solvent or solvent mixture. The solvent is then removed e.g. by distillation. Suitable solvents are e.g. non-polar or polar non-protic solvents like ethers, cyclic ethers, e.g. THF, or PGMEA, or aromatic solvents like toluene.

The invention further provides a process in which an LED is encapsulated with an organopolysilazane material of the invention, comprising the steps of dispensing and curing of the organopolysilazane material.

In a first step the organopolysilazane material of the invention, which has preferably been pre-crosslinked as described above, is applied to an LED or its precursor materials, e.g. with an industrial available dispensing system.

In a preferred embodiment, the organopolysilazane material of the invention is applied to the LED as such, i.e. without further dilution. Suitable organopolylsilazanes for that kind of application are e.g. characterized by a viscosity range of 100 to 100,000 mPas at a temperature of 25° C. Viscosity is determined by using the following equipment and conditions: Brookfield Rheometer R/S plus, Brookfield cone-type spindle $RC_3$-50-1, rotation speed of 3 rpm., temperature 25° C. To adjust the viscosity, the temperature during the dispensing process can be varied, generally between 10° C. and 60° C.

In a further embodiment of the invention, the organopolysilazane material, which has preferably been pre-crosslinked as described above, is applied to the LED or its precursor materials in diluted form. Suitable solvents are: solvents that are non-reactive with the organosilazane and especially the Si—H group, at least at short term contact under ambient conditions. Useful solvents are for example (cyclo)alkanes, ethers, esters and aromatic compounds. Examples of useful solvents are n-heptane, cyclohexane, THF, 1,4-dioxane, Di-(iso)propylether, ethyl acetate, butyl acetate, toluene and xylene.

After dispensing the organopolysilazane material to the unfinished LED, the material is subjected to a curing process. During this process the liquid and/or oil type material is transformed into a solid material. The mechanical properties of the solid material can be controlled from soft rubber-like to hard glass-like, depending on the chemistry of the organopolysilazane. The curing process is triggered by radiation or heat or crosslinking catalysts, or a combination of heat and crosslinking catalyst or radiation and a crosslinking catalyst. In case of thermal curing, the material is cured for 1 min to 6 h, preferably 30 min to 5 h, more preferred 3 to 4 h, in particular about 4 h, at a temperature of from 80 to 220° C., preferably 110 to 170° C., more preferred of from 120 to 160° C., in an inert atmosphere or air, preferably an inert, more preferably nitrogen atmosphere.

In a preferred embodiment of the process of the invention, a heating step is carried out before the actual curing, by heating the LED device with the encapsulation material to a temperature of from 60 to 70° C. for 30 min to 4 h for degasing purposes.

The curing is a result of the crosslinking of the Si-vinyl groups with Si—H. This addition reaction is triggered by simple heating, by applying a high energy radiation, or by a radical reaction caused by a radical generating catalyst (e.g. peroxyde or azo-compounds, such as 2.2-di(t.-butylperoxy) butane) activated by heat or radiation or by a metal catalyst (e.g. Pt- or Pd-compounds).

It is readily understood by those skilled in the art that in the curing step, in particular in an oxygen-containing atmosphere, such as an ambient atmosphere, or especially during the lifetime of the LED, where the LED encapsulant is exposed to air at higher operating temperatures up to 120° C. in combination with intensive light radiation, a certain amount of the —$SiR_2$—NH moieties in the organopolysilazane material is converted to Si—O groups.

However, in the material of the invention the majority of the $SiR_2$—NH groups is maintained, typically >80%, preferably >85%, more preferred >90% (by FTIR). Typically only the surface of the encapsulant—which is in direct contact with oxygen of the atmosphere—is slightly oxidised. FT-IR spectra of the surface and the material 500 μm below the surface show only a small amount Si—O signals at the surface. The major signals of the Si—N, Si—H and N—H groups still remain unchanged, which proves that only a minor oxidation takes place. The FT-IR of the material 500 µm below the surface shows almost unchanged polysilazane.

The organopolysilazanes of the invention can be cured at high temperatures in a short time, thus ensuring sufficient curing in the drying section. Since polysilazanes show great temperature stability, a higher curing temperature is possible than in the case of conventional coating systems, such as e.g. epoxy resins. The only limits on this temperature are generally those imposed by the thermal deformability of the LED material.

Curing of the polysilazane coating in the encapsulation process of the invention takes place preferably at an [oven] temperature of 90° C. to 200° C., preferably 110° C. to 170° C., more preferably 120° C. to 160° C. The drying time is usually 2 to 10 h, preferably 4 to 6 h, depending on the thickness of the material.

The encapsulating material obtained by curing the organopolysilazane material of the invention is new.

The encapsulating material of the invention is obtainable by
a) Providing the organopolysilazane material of the invention,
b) Optionally crosslinking the organopolysilazane material of the invention by treatment with a base, and
c) Curing the organopolysilazane material of the invention by heating it to a temperature of from 80° C. to 220° C. for a period of from 1 min to 6 h in an inert atmosphere or air.

The organopolysilazanes of the invention are used as insulating transparent filling materials for light emitting diodes (LED). The encapsulant is highly transparent in UV and visible (typically 99% at 400 nm in 1 mm path). The material shows thermal stability that means the transmission is still at least 90% at 400 nm after exposure to 150° C. for 6 h in nitrogen. The encapsulant shows resistance to UV radiation, i.e., the transmission is typically 98% after exposure to UV-A light (315-400 nm) for 6 h. The combination of UV light and thermal exposure to 150° C. for 6 h of the encapsulant still shows a transmission of 90%. The encapsulant has a refraction index of 1.35 or higher, typically of from 1.40 to 2.50, preferably 1.45 to 2.00. The refractive index can be adjusted by adding inorganic fillers like as described above.

The encapsulation material for LEDs according to the invention can be used in a variety of LED devices such as high brightness light emitting diodes (HBLEDs), vertical cavity surface emitting lasers (VCSELs), laser diodes, flat panel displays, projection display optics components, injection-moldable optical lenses and other optical parts, devices and structures. It can be further used as part of photo semiconductor devices mounted with blue or white LED elements. LEDs comprising the encapsulation material of the invention can be used for backlights for liquid crystal displays, traffic lights, outdoor big displays, advertisement sign boards and the like.

In a further embodiment, the invention provides an LED comprising the encapsulation material of the invention.

A typical LED package according to the invention comprises an LED chip, and/or a lead frame and/or gold wire and/or solder (flip chip) and/or the filling material, converter, the encapsulation material of the invention and a primary and secondary optic. The encapsulation material has the function of a surface protection material against external environmental influences and guarantees long term reliability in particular aging stability.

For example, in accordance with the present invention a light emitting diode is constructed similarly to the ones described in U.S. Pat. Nos. 6,274,924 and 6,204,523. In a preferred embodiment, a light emitting diode (LED) component is provided comprising: an LED chip emitting light having a wavelength in a range of 200 to 570 nm; and
a package including a organopolysilazane optic encasing the LED chip, the organopolysilazane optic comprising an organopolysilazane material of the invention being transmissive to light in a wavelength range from ultraviolet through green, wherein the organopolysilazane material of the invention maintains its transmissiveness when exposed to a temperature of 100° C.; and
a light-emitting substance, embedded in the organopolysilazane material, the light-emitting substance emitting light responsive to excitation by light of a predetermined wavelength, wherein the light emitted by the light emitting substance has a peak wavelength greater than the peak wavelength of light emitted by the LED chip.

The invention is further illustrated by the following examples without limiting it thereto.

EXAMPLES

Synthesis Examples

The following examples are meant to demonstrate the base-catalyzed crosslinking of low molecular weight oligomeric organosilazanes to produce higher molecular weight polysilazanes useful for application as bulk encapsulant. Besides the higher molecular weight, these polysilazanes are distinguished by a high-viscous oil-like appearance and a low weight loss on heating.

The following examples demonstrate the base catalyzed crosslinking of the organosilazanes Durazane 1033 (formerly ML-33) and DURAZANE-1800 (formerly HTT 1800) available from AZ Electronic Materials Germany GmbH, Wiesbaden, Germany.

Example No. 1

A 250 ml flask was purged with dry nitrogen and charged with 50 g HTT-1800 and 100 g n-heptane. After cooling down to 0° C., 0.5 g of potassium-hexamethyldisilazane were added. After addition of the catalyst, gas formation could be observed. The mixture was stirred for 2 h at 0° C. and for additional 2 h at 20° C. Then 0.5 g chlorotrimethylsilane were added. The precipitate was removed by filtration and all of the solvent was removed by evaporation under reduced pressure.

Yield: 47 g of a colorless to slightly yellow viscous oil.

Example No. 2

A 250 ml flask was purged with dry nitrogen and charged with 25 g HTT-1800, 25 g ML-33 and 100 g THF. After cooling down to 0° C., 0.5 g of potassium-hexamethyldisilazane were added. After addition of the catalyst, gas formation could be observed. The mixture was stirred for 2 h at 0° C. and for additional 2 h at 20° C. Then 0.5 g chlorotrimethylsilane were added. The precipitate was removed by filtration and all of the solvent was removed by evaporation under reduced pressure.

Yield: 48 g of a colorless viscous oil.

Example No. 3

A 250 ml flask was purged with dry nitrogen and charged with 16.7 g HTT-1800, 33.3 g ML-33 and 100 g 1,4-Dioxane. After cooling down to 0° C., 0.5 g of potassium-hexamethyldisilazane were added. After addition of the catalyst, gas formation could be observed. The mixture was stirred for 2 h at 0° C. and for additional 2 h at 20° C. Then 0.5 g chlorotrimethylsilane were added. The precipitate was removed by filtration and all of the solvent was removed by evaporation under reduced pressure.

Yield: 47 g of a colorless viscous oil.

Example No. 4

A 250 ml flask was purged with dry nitrogen and charged with 12.5 g HTT-1800, 37.5 g ML-33 and 100 g THF. After cooling down to 0° C. 0.3 g of sodium-amide were added. After addition of the catalyst, gas formation could be observed. The mixture was stirred for 2 h at 0° C. and for additional 2 h at 20° C. and finally another 2 h at 40° C. Then 0.5 g chlorotrimethylsilane were added. The precipitate was removed by filtration and all of the solvent was removed by evaporation under reduced pressure.

Yield: 46 g of a colorless viscous oil.

of the Si—N, Si—H and N—H groups still remain unchanged, which proves that only a minor oxidation occurred. The FT-IR of the material 500 μm below the surface is almost unchanged polysilazane.

Example No. 6 Curing Process of an Encapsulant on an LED Board

In Example No. 6 the curing process of an encapsulant on an LED board is described.

The mother board of the experiment consisted of 20 LEDs which were mounted on a circuit board. Each LED was connected to a temperature sensor. Two types of LEDs ("white" and "UV (400 nm)") were used. Half of the number of LEDs was coated with the encapsulation material of Synthesis Example 4. The encapsulation material was cured after addition of 0.5% of Peroxan® PK 234 (2,2-di(t.-butylperoxy)butane) on the board. Half of the number of LEDs stayed uncoated (for reference).

TABLE 1

Summary of the Synthesis Examples

| Example | Raw material | Solvent | Catalyst | Temperature | Molecular weight* | Appearance | Viscosity [mPas]/25° C. |
|---|---|---|---|---|---|---|---|
| 1. | HTT-1800 | Heptane | $KN(SiMe_3)_2$ | 0-20° C. | 4230 | liquid/oil | 21300 |
| 2. | HTT-1800:ML-33 = 1:1 | THF | $KN(SiMe_3)_2$ | 0-20° C. | 5750 | liquid/oil | 42400 |
| 3. | HTT-1800:ML-33 = 1:2 | Dioxane | $KN(SiMe_3)_2$ | 0-20° C. | 4980 | liquid/oil | 37600 |
| 4. | HTT-1800:ML-33 = 1:3 | THF | NaH | 0-40° C. | 6100 | liquid/oil | 50600 |
| ML-33 (reference) | — | — | — | — | 2210 | liquid | 19 |
| HTT-1800 (reference) | — | — | — | — | 2390 | liquid | 80 |

*the molecular weight was analyzed by GPC (size exclusion chromatography) using Polystyrene standards By comparing Examples 1 to 4, it can be demonstrated that it is possible to synthesize liquid oil-like polysilazanes by base catalyzed crosslinking. The viscosity is controlled by adjusting the amount and type of catalyst, the solvent and the reaction temperature and time. By using different types and mixtures of the raw materials, it is possible to determine the organic moieties at the silicon and the nitrogen atom of the silazane backbone. In Examples 1 to 4 the ratio of hydrogen, methyl and vinyl bound to the silicon was varied.

Application Examples

Example No. 5 FT-IR Spectrum

Figure 1:
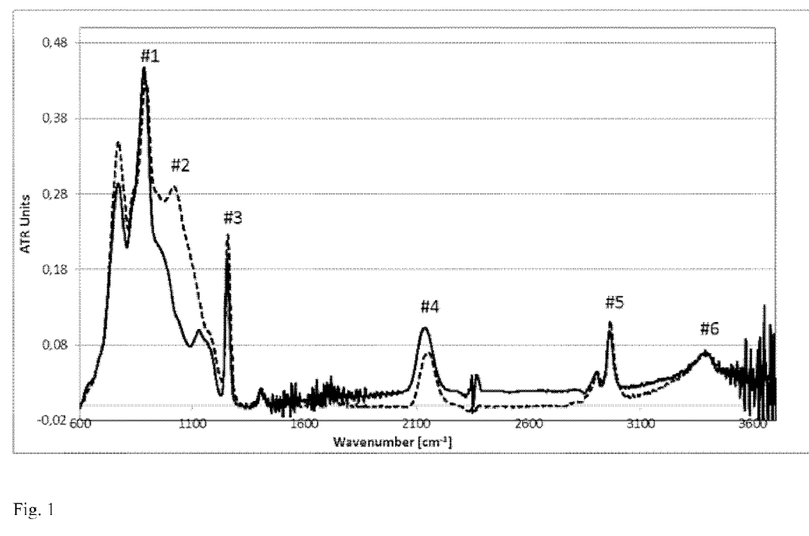

FIG. 1 shows the FT-IR spectrum of the above described specimen:
-------- FT-IR trace of surface in contact with air
———— FT-IR trace of material 500 μm below the surface
peak assignment: #1: Si—N
  #2: Si—O
  #3: Si—$CH_3$
  #4: Si—H
  #5: C—H
  #6: N—H Example No. 5 shows two FT-IR traces of the cured material of a specimen exposed to 420 nm radiation in combination with a temperature of 140° C. for 3 days. One is the spectrum of the surface and the second one is of the material 500 μm below the surface. Only a small amount of Si—O signals is detectable at the surface. The major signals The curing of the encapsulant involved several steps. The mother board was heated on a hotplate up to 80° C. whilst the encapsulation material was degased in an ultrasonic bath. Then the encapsulation material was also heated up to 80° C. on the hotplate to decrease viscosity and the encapsulation material was filled into a pipette without making air bubbles. The encapsulant material was dispensed slowly and uniformly on the LEDs with the pipette under avoiding of further building of air bubbles. The mother board with the encapsulated LEDs and the uncoated reference LEDs was heated at 120° C. up to 3.5 h in an oven under standard pressure nitrogen.

Example No. 7 Optical Transmission Vs. Wavelength (Before and after UV Radiation and Temperature Exposure)

Figure 2:
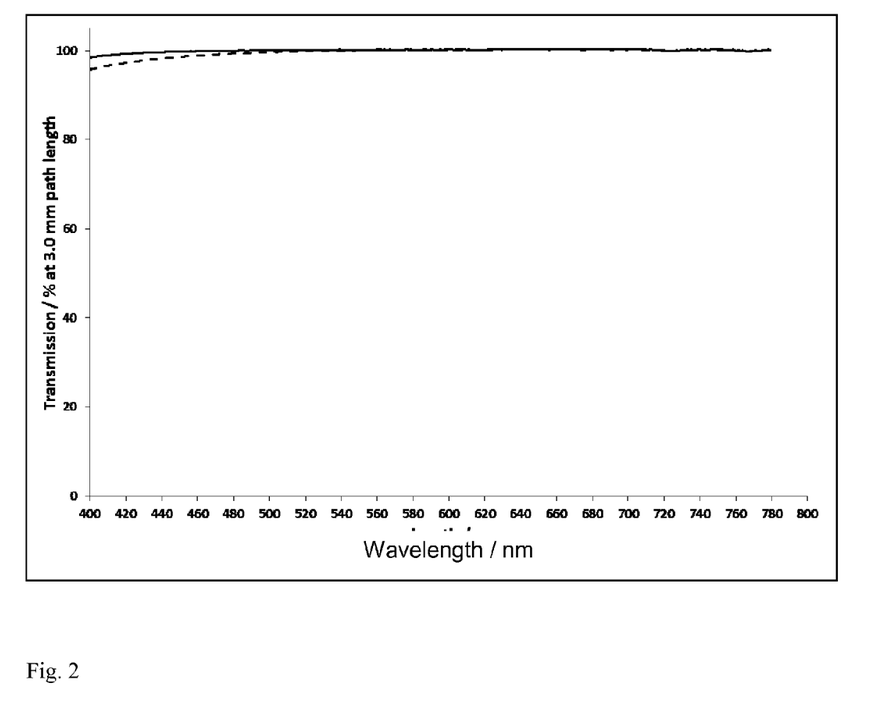

FIG. 2 shows the optical transmission versus wavelength of cured material of 3 mm thickness. The encapsulation material was cured in two Teflon forms 3×2 cm with a depth of ca. 3 mm at 120° C. for about 4 h in an oven under standard pressure nitrogen. The cured material was taken out of the Teflon form after cooling up to room temperature.

One cured material was hold back as reference. The other one was treated for 72 h with 120° C. and UV radiation at 400 nm. The optical spectrum of both materials was measured with spectral photometry in an Ulbricht sphere:

———— before treatment

-------- after treatment at 120° C. and UV radiation for 72 h.

Example No. 8 UV Resistance and Non-Yellowing Properties

The encapsulated LEDs and uncoated LEDs from Example No. 6 were operated (lighting) for 500 h at controlled ambient temperatures.

The change of the emitted light of each LED was monitored periodically.

Figure 3:
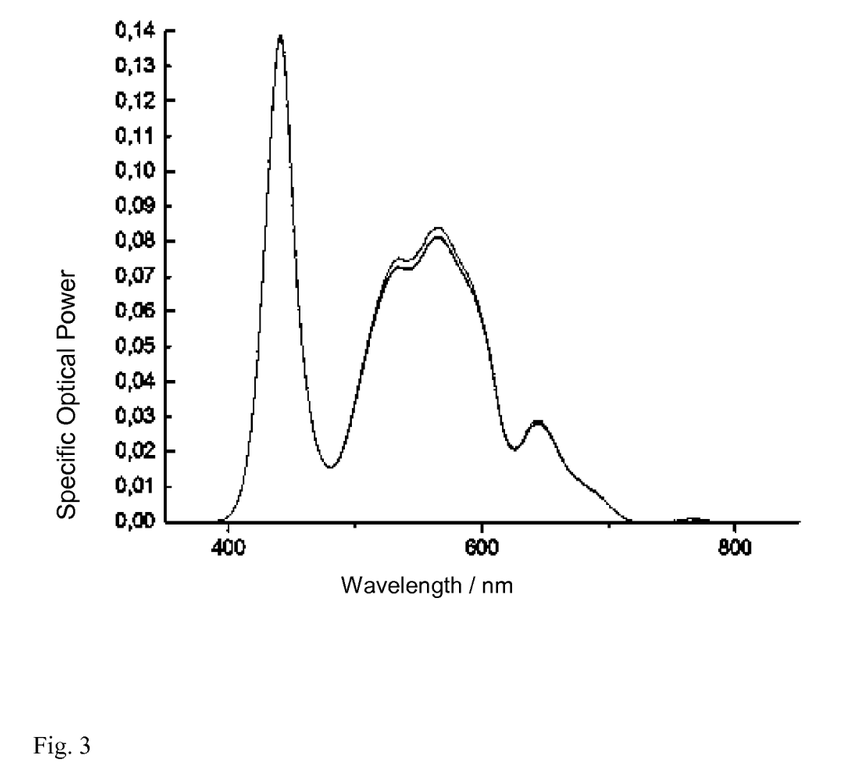

FIG. 3 shows the emission of the coated white LEDs before and after 500 h of UV radiation treatment. The spectra were corrected for the spectra of the reference LEDs:
----- mission spectra before temperature and UV radiation treatment
⎯⎯ emission spectra after temperature and UV radiation treatment for 500 h.

The invention claimed is:

1. A cured encapsulation material for a light emitting diode, wherein an organopolysilazane material, comprising repeating units of formulae (I) and (II) has been subjected to a curing step by treating the material to a temperature in the range of from 80 to 220° C. for a period of from 1 min to 6 h in an inert atmosphere, wherein the symbols and indices have the following meanings:
$R^1$ is vinyl or allyl;
$R^2$ is $(C_1-C_4)$-alkyl, phenyl or H;
$R^3$ is H;
$R^4$ is $(C_1-C_4)$-alkyl, phenyl or H;
$R^5$ is H;
x is 0.03 to 0.075 and
y is 2*x to 0.97
with the proviso that x+y≤1 and that y can be 0 if $R^2$ is H.

2. The cured encapsulation material for a light emitting diode according to claim 1, wherein
$R^1$ is vinyl;
$R^2$ is methyl, ethyl, propyl or phenyl;
$R^3$ is H and
$R^4$ is methyl, ethyl, propyl or phenyl;
$R^5$ is H;
x is 0.03 to 0.06 and
y is 2*x to 0.97.

3. The cured encapsulation material for a light emitting diode according, to claim 1, wherein the organopolysilazane comprises one or more organopolysilazane comprising a repeating unit of formula (I) or formula (I) and formula (II) and one or more repeating units of formula (III) and/or (IV), wherein
$R^6$, $R^7$, and $R^9$ are independently an organic group;
$R^{10}$ is H or an organic group, and
$R^8$ and $R^{11}$ are independently H or an organic group.

4. The cured encapsulation material for a light emitting diode according to claim 3, wherein the symbols in formulae (III) and (IV) have the following meanings:
$R^6$, $R^7$ and $R^9$ are independently $(C_1-C_8)$-alkyl, $(C_3-C_6)$-cycloalkyl or $(C_6-C_{10})$-aryl,
$R^{10}$ is independently $(C_1-C_8)$-alkyl, $(C_3-C_6)$-cycloalkyl or $(C_6-C_{10})$-aryl, $(C_2-C_6)$-alkenyl, $(C_4-C_6)$-alkadienyl or H and
$R^8$ and $R^{11}$ are H, $(C_1-C_8)$-alkyl, $(C_3-C_6)$-cycloalkyl or $(C_6-C_{10})$-aryl.

5. A crosslinked encapsulation material for a light emitting diode wherein an organopolysilazane material comprising repeating units of formulae (I) and (II) has been subjected to crosslinking by treatment with a base wherein the symbols and indices have the following meanings:
$R^1$ is $C_2-C_6$-alkenyl or $C_4-C_6$-alkadienyl;
$R^2$ is H or an organic group;
$R^3$ is H or an organic group;
$R^4$ is H or an organic group;
$R^5$ is H or an organic group;
x is 0.001 to 0.2; and
y is 2x to (1−x),
with the proviso that x+y≤1 and that y can be 0 if $R^2$ is H.

6. The cured encapsulation material for a light emitting diode according to claim 1, wherein the molecular weight Mw of the organopolysilazanes is in the range of 2000-150,000.

7. The cured encapsulation material for a light emitting diode according to claim 1, wherein the organopolysilazane material has a viscosity of 100-100,000 mPas at 25° C.

8. The cured encapsulation material for a light emitting diode according to claim 1, wherein the amount of low molecular material with $M_w$<500 g/mol in the organopolysilazane material is below 15 wt.-%.

9. An LED encapsulated with a cured encapsulation material for a light emitting diode wherein an organopolysilazane material comprising repeating units of formula (I) and (II)

wherein the symbols and indices have the following meanings: $R^1$ is C2-C6-alkenyl or C4-C6-alkadienyl;
$R^2$ is H or an organic group;
$R^3$ is H or an organic group;
$R^4$ is H or an organic group;
$R^5$ is H or an organic group;
x is 0.001 to 0.2;
y is 2x to (1−x),
and with the proviso that x+y≤1 and that y can be 0 if $R^2$ is H,
is applied as a layer in a thickness of from 200 μm to 5 mm, and wherein the encapsulation material is a thermally stable, insulating transparent filling material.

10. A process for encapsulating an LED, comprising the steps of
a) applying an organopolysilazane material to the LED as an encapsulation layer and
b) curing the organopolysilazane of the invention for 1 min to 6 h at a temperature of from 80° C. to 220° C. in an inert atmosphere or air:

wherein the organopolysilazane material comprises repeating units of formulae (I) and (II):

$$[-SiR^1R^2-NR^3-]_x \quad (I)$$

$$[-SiHR^4-NR^5-]_y \quad (II)$$

wherein the symbols and indices have the following meanings:
$R^1$ is $C_2$-$C_6$-alkenyl or $C_4$-$C_6$-alkadienyl;
$R^2$ is H or an organic group;
$R^3$ is H or an organic group;
$R^4$ is H or an organic group;
$R^5$ is H or an organic group;
x is 0.001 to 0.2; and
y is 2x to (1−x),
with the proviso that x+y≤1 and that y can be 0 if $R^2$ is H.

11. The process according to claim 10, wherein the curing step b) is carried out in the presence of a catalyst selected from peroxy compounds, azo compounds, Pt-compounds and Pd-compounds.

12. The process according to claim 10, wherein the organopolysilazane material is applied as a layer in a thickness of from 200 nm to 5 mm.

13. An encapsulation material for LED, obtainable by
a) providing a crosslinked organopolysilazane material as described in claim 5,
b) thermal curing the crosslinked organopolysilazane material by treating the material to a temperature in the range of from 80° C. to 220° C. for a period of from 1 min to 6 h in an inert atmosphere or air.

14. An LED, comprising the material as described in claim 1 as an encapsulating material.

15. An LED, comprising the material as described in claim 13 as an encapsulating material.

16. The crosslinked encapsulation material for a light emitting diode according to claim 5, wherein
$R^1$ is ($C_2$-$C_6$)-alkenyl or ($C_4$-$C_6$)-alkadienyl;
$R^2$ is ($C_1$-$C_8$)-alkyl, ($C_2$-$C_6$)-alkenyl, ($C_3$-$C_6$)-cycloalkyl, ($C_6$-$C_{10}$)-aryl or H;
$R^3$ is H or ($C_1$-$C_8$)-alkyl, ($C_2$-$C_6$)-alkenyl, ($C_3$-$C_6$)-cycloalkyl or ($C_6$-$C_{10}$)-aryl; $R^4$ is H or ($C_1$-$C_8$)-alkyl, ($C_2$-$C_6$)-alkenyl, ($C_3$-$C_6$)-cycloalkyl or ($C_6$-$C_{10}$)-aryl; $R^5$ is H or ($C_1$-$C_8$)-alkyl, ($C_2$-$C_6$)-alkenyl, ($C_3$-$C_6$)-cycloalkyl or ($C_6$-$C_{10}$)-aryl;
x is 0.02 to 0.1 and
y is 2*x to 0.98.

17. The crosslinked encapsulation material for a light emitting diode according to claim 5, wherein
$R^1$ is vinyl or allyl;
$R^2$ is ($C_1$-$C_4$-alkyl, phenyl or H;
$R^3$ is H;
$R^4$ is ($C_1$-$C_4$)-alkyl, phenyl or H;
$R^5$ is H;
x is 0.03 to 0.075 and
y is 2*x to 0.97.

18. The crosslinked encapsulation material for a light emitting diode according to claim 5, wherein
$R^1$ is vinyl;
$R^2$ is methyl, ethyl, propyl or phenyl;
$R^3$ is H and
$R^4$ is methyl, ethyl, propyl or phenyl;
$R^5$ is H;
x is 0.03 to 0.06 and
y is 2*x to 0.97.

19. The crosslinked encapsulation material for a light emitting diode according to claim 5, wherein the organopolysilazane comprises one or more organopolysilazane comprising a repeating unit of formula (I) or formula (I) and formula (II) and one or more repeating units of formula (III) and/or (IV), $$-[Si(R^6)(R^7)-NR^8]- \quad (III)$$

$$-[Si(R^9)(R^{10})-NR^{11}-CO-NH]- \quad (IV)$$

wherein
$R^6$, $R^7$, $R^8$, $R^9$, $R^{10}$ are independently an organic group;
$R^{10}$ is H or an organic group, and
$R^8$ and $R^{11}$ are independently H or an organic group.

20. The crosslinked encapsulation material for a light emitting diode according to claim 5, wherein the symbols in formulae (III) and (IV) have the following meanings:
$R^6$, $R^7$ and $R^9$ are independently ($C_1$-$C_8$)-alkyl, ($C_3$-$C_6$)-cycloalkyl or ($C_6$-$C_{10}$)-aryl,
$R^{10}$ is independently ($C_1$-$C_8$)-alkyl, ($C_3$-$C_6$)-cycloalkyl or ($C_6$-$C_{10}$)-aryl, ($C_2$-$C_6$)-alkenyl, ($C_4$-$C_6$)-alkadienyl or H and
$R^8$ and $R^{11}$ are H, ($C_1$-$C_8$)-alkyl, ($C_3$-$C_6$)-cycloalkyl or ($C_6$-$C_{10}$)-aryl.

21. The crosslinked encapsulation material for a light emitting diode according to claim 5, wherein the molecular weight Mw of the organopolysilazanes is in the range of 2000-150,000.

22. The crosslinked encapsulation material for a light emitting diode according to claim 5, wherein the organopolysilazane material has a viscosity of 100-100,000 mPas at 25° C.

23. The crosslinked encapsulation material for a light emitting diode according to claim 5, wherein the amount of low molecular material with Mw <500 g/mol in the organopolysilazane material is below 15 wt.-%.

24. The crosslinked encapsulation material for a light emitting diode according to claim 5, wherein the organopolysilazane material is applied as a layer in a thickness of from 200 μm to 5 mm.

* * * * *